US009601176B2

(12) United States Patent
Takaya et al.

(10) Patent No.: US 9,601,176 B2
(45) Date of Patent: Mar. 21, 2017

(54) NONVOLATILE MEMORY

(71) Applicant: Kabushiki Kaisha Toshiba, Minato-ku (JP)

(72) Inventors: Satoshi Takaya, Kawasaki (JP); Hiroki Noguchi, Yokohama (JP); Shinobu Fujita, Inagi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/067,967

(22) Filed: Mar. 11, 2016

(65) Prior Publication Data

US 2016/0276010 A1   Sep. 22, 2016

Related U.S. Application Data

(63) Continuation of application No. PCT/JP2015/068825, filed on Jun. 30, 2015.

(30) Foreign Application Priority Data

Mar. 20, 2015  (JP) ................. 2015-058047

(51) Int. Cl.
   *G11C 11/00*   (2006.01)
   *G11C 11/16*   (2006.01)
   *G11C 27/02*   (2006.01)

(52) U.S. Cl.
   CPC ........ *G11C 11/1675* (2013.01); *G11C 11/161* (2013.01); *G11C 11/1677* (2013.01); *G11C 27/024* (2013.01)

(58) Field of Classification Search
   CPC .................................... G11C 11/00
   USPC ....................... 365/148, 158, 163
   See application file for complete search history.

(56) References Cited

U.S. PATENT DOCUMENTS

2002/0051381 A1   5/2002  Numata et al.
2009/0109736 A1   4/2009  Katou
           (Continued)

FOREIGN PATENT DOCUMENTS

JP   2002-100181      4/2002
JP   2003-109374 A    4/2003
           (Continued)

OTHER PUBLICATIONS

International Search Report issued Aug. 18, 2015 in PCT/JP2015/068825, filed Jun. 30, 2015 (with English Translation of Categories of Cited Documents).
           (Continued)

*Primary Examiner* — Harry W Byrne
(74) *Attorney, Agent, or Firm* — Oblon, McClelland, Maier & Neustadt, L.L.P.

(57) ABSTRACT

According to one embodiment, a nonvolatile memory includes a memory cell, a write circuit generating a write current to change the memory cell from a first resistance value to a second resistance value, a first current generating circuit generating a first current based on the write current flowing through the memory cell, a second current generating circuit generating a second current based on the write current flowing through the memory cell, a hold circuit holding a first value generated based on the second current when the memory cell stores the first resistance value, a comparator comparing the first value with a second value generated based on a change of the first current while the memory cell changes from the first resistance value to the second resistance value, and a write current control circuit cutting off the write current based on a result of comparison of the comparator.

20 Claims, 12 Drawing Sheets

(56) References Cited

U.S. PATENT DOCUMENTS

| | | |
|---|---|---|
| 2010/0246251 A1 | 9/2010 | Chen et al. |
| 2011/0078538 A1 | 3/2011 | Ikegawa et al. |
| 2011/0157958 A1 | 6/2011 | Sasaki |
| 2011/0157966 A1 | 6/2011 | Lee |
| 2012/0099367 A1* | 4/2012 | Azuma .............. G11C 13/0007 365/148 |
| 2013/0223133 A1* | 8/2013 | Azuma .............. G11C 13/0007 365/148 |
| 2014/0293685 A1* | 10/2014 | Noguchi .............. G11C 11/1675 365/158 |

FOREIGN PATENT DOCUMENTS

| | | |
|---|---|---|
| JP | 2006-294178 A | 10/2006 |
| JP | 2011-134383 | 7/2011 |
| JP | 2011-138598 A | 7/2011 |
| JP | 2012-22726 A | 2/2012 |
| JP | 2012-522329 | 9/2012 |
| WO | WO 2007/015358 A1 | 2/2007 |
| WO | WO 2008/012871 A1 | 1/2008 |

OTHER PUBLICATIONS

Written Opinion issued Aug. 18, 2015 in PCT/JP2015/068825, filed Jun. 30, 2015.

Daisuke Suzuki, et al., "Optimally Self-Terminated Compact Switching Circuit Using Continuous Voltage Monitoring Achieving High Read Margin for STT MRAM and Logic" IEEE, International Magnetics Conference, 2014, 1 Page.

Ping Zhou, et al., "Energy Reduction for STT-RAM Using Early Write Termination" IEEE/ACM International Conference on Computer-Aided Design Digest of Technical Papers, 2009, pp. 264-268.

* cited by examiner

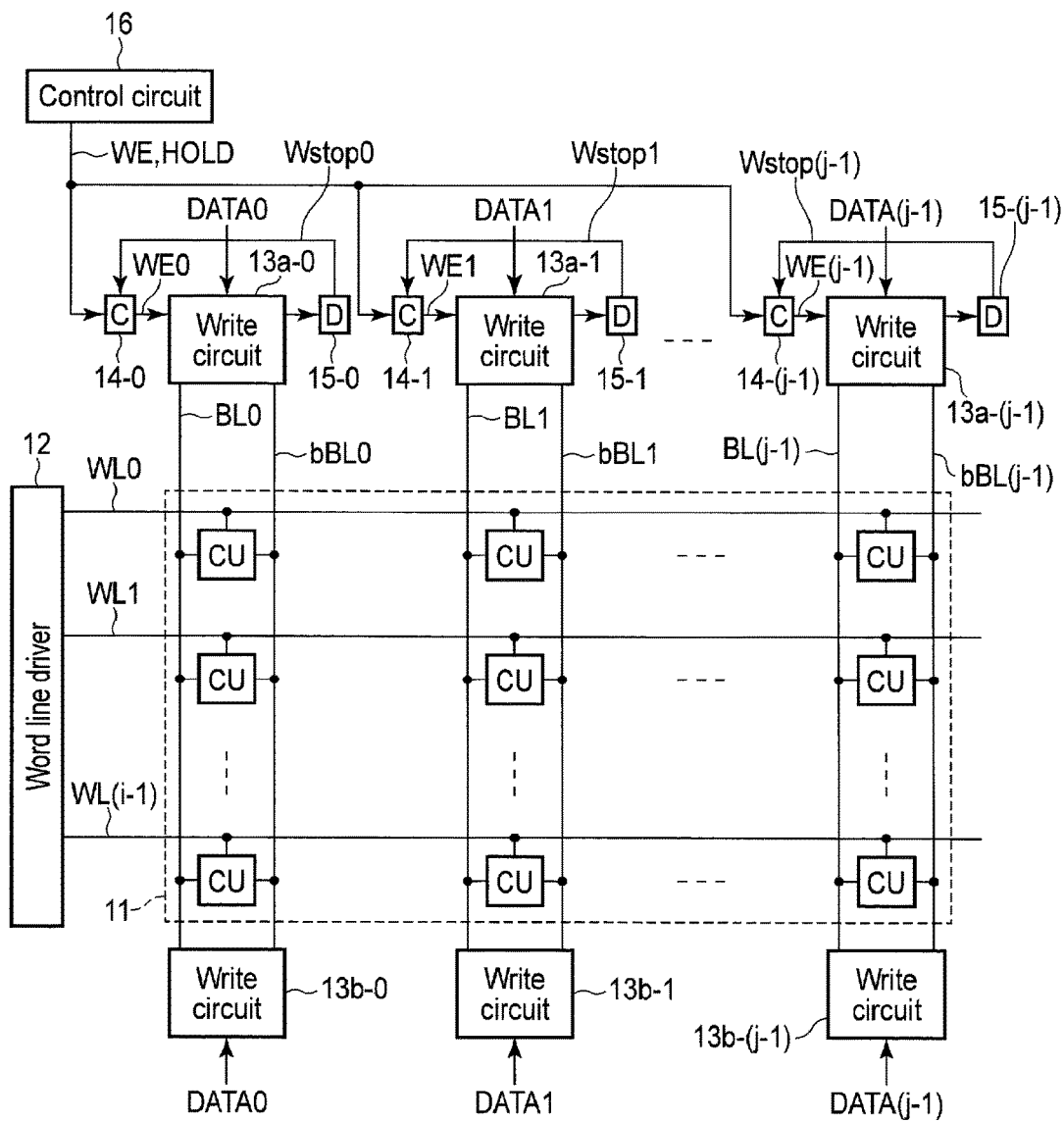
F I G. 1

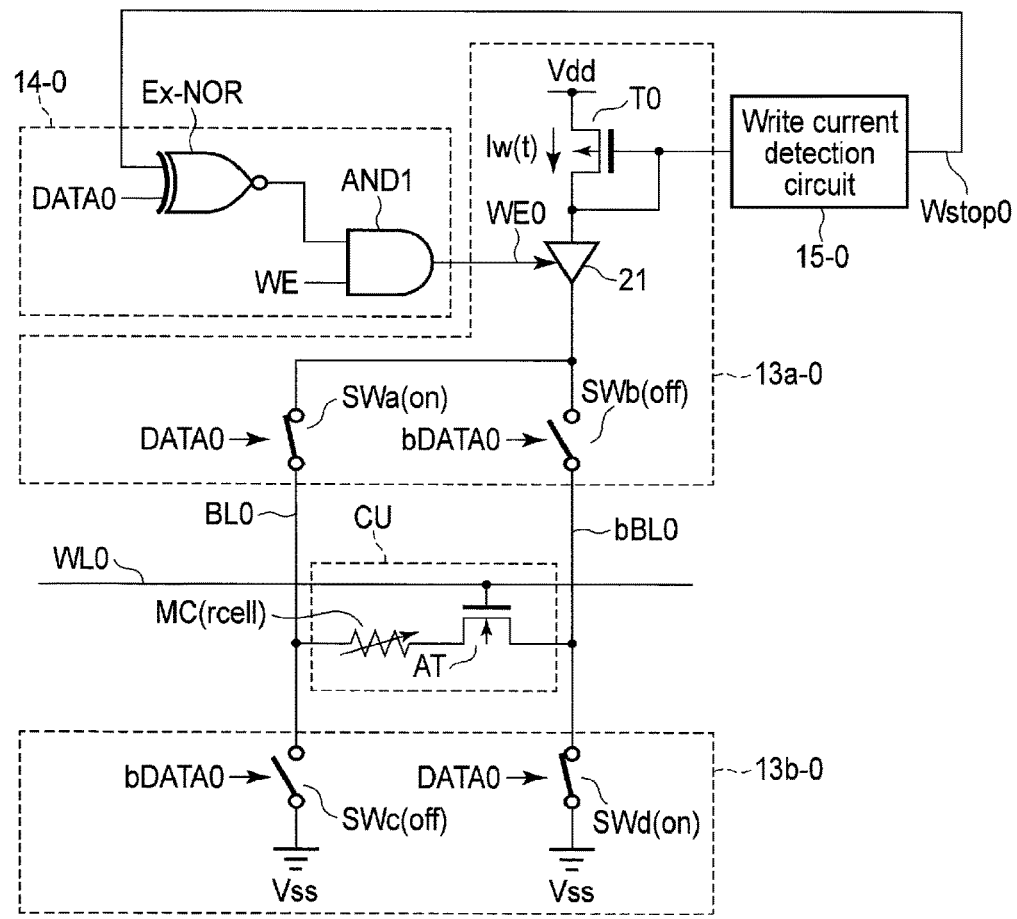
F I G. 2A

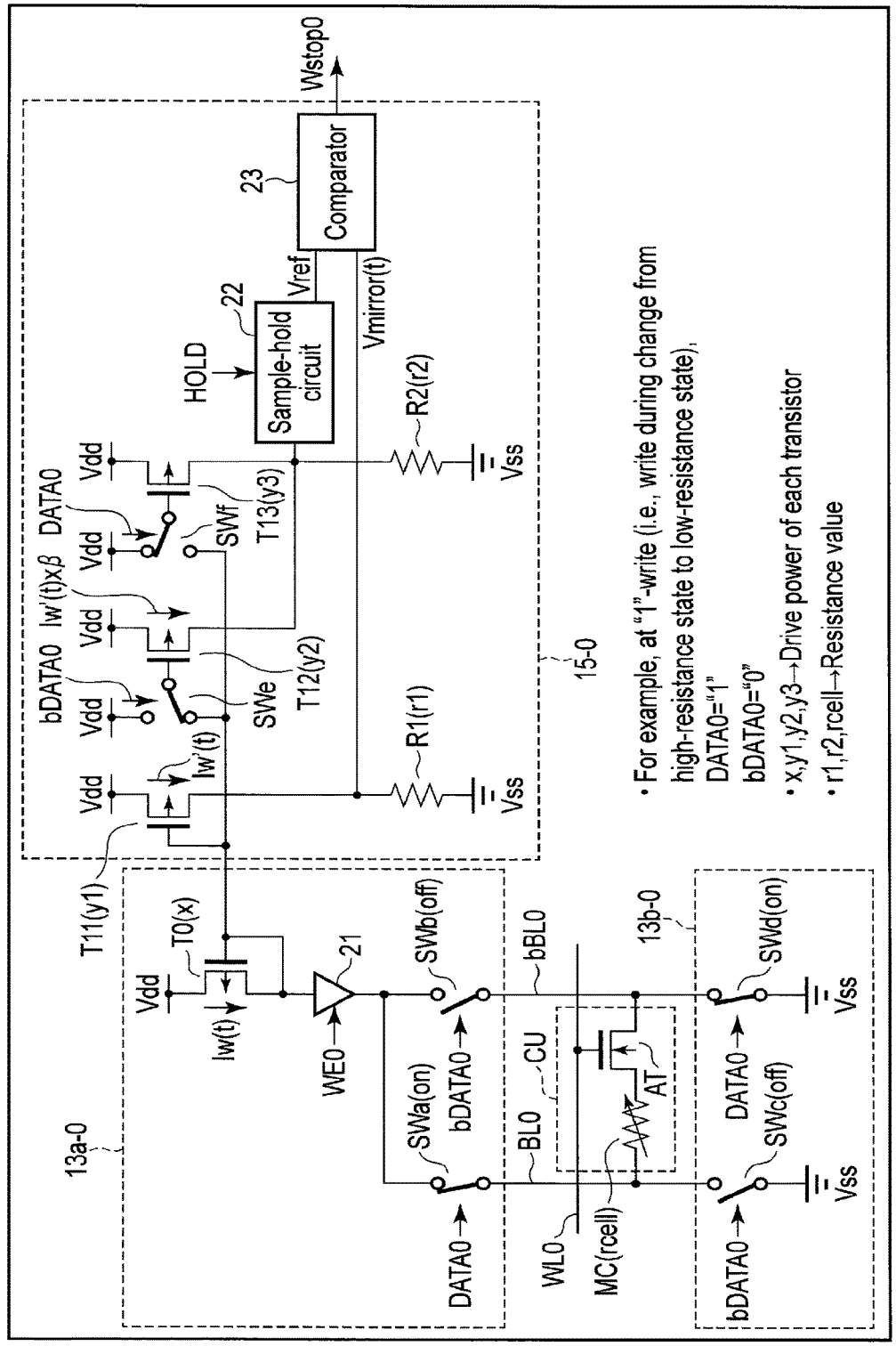
F I G. 5

NONVOLATILE MEMORY

CROSS REFERENCE TO RELATED APPLICATIONS

This application is a Continuation Application of PCT Application No. PCT/JP2015/068825, filed Jun. 30, 2015 and based upon and claiming the benefit of priority from Japanese Patent Application No. 2015-058047, filed Mar. 20, 2015, the entire contents of all of which are incorporated herein by reference.

FIELD

Embodiments described herein relate generally to a nonvolatile memory.

BACKGROUND

To increase the cell area of a static random access memory (SRAM) and to increase the standby power in response to miniaturization, research for utilizing not the SRAM which has been conventionally used, but a nonvolatile, large-capacity and high-speed next-generation nonvolatile semiconductor memory such as a spin-transfer-torque magnetic random access memory (STT-MRAM) as a cache memory of the processor have been advanced.

For example, since STT-MRAM is capable of storing data in a nonvolatile state, STT-MRAM can reduce the standby power more remarkably than a conventional SRAM. In addition, the cell area of the STT-MRAM is smaller than the cell area of the SRAM. For example, the cell area of the STT-MRAM for storing data per bit needs only to be one fourth to one tenth of that of the SRAM. Furthermore, the STT-MRAM can execute high-speed read/write operations, similarly to the SRAM.

Thus, the next-generation nonvolatile semiconductor memory is expected to contribute to the enhancement in performance of the processor.

In contrast, the next-generation nonvolatile semiconductor memory requires a comparatively large write current when, for example, data is written in the memory cell. For this reason, the write needs to be executed with a write pulse width as short as possible, to reduce the power consumption at the write.

In general, however, the write property (write pulse width necessary for the write) of the memory cell is varied. In consideration of this, the write pulse width needs to correspond to the memory cell having the worst property and, as a result, sufficient reduction in the write pulse width and lower power consumption are difficult.

BRIEF DESCRIPTION OF THE DRAWINGS

FIG. 1 is a block diagram showing major portions of a nonvolatile memory.

FIG. 2A and FIG. 2B are block diagrams showing an example of a write current control circuit.

FIG. 5 is a block diagram showing an example of the write current detection circuit at "1"-write.

DETAILED DESCRIPTION

Figure 2B:
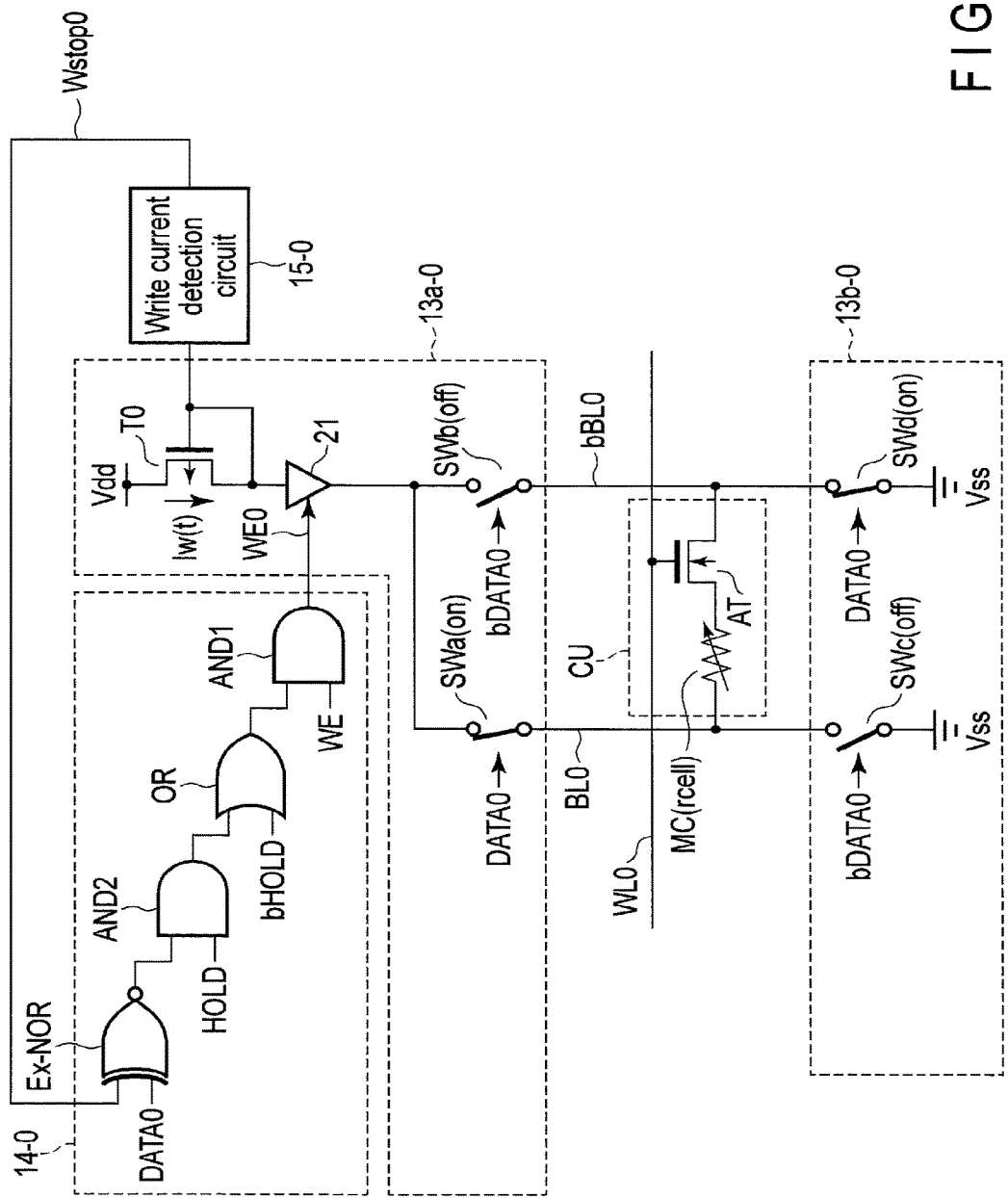

In general, according to one embodiment, a nonvolatile memory comprises: a memory cell; a write circuit generating a write current to change the memory cell from a first resistance value to a second resistance value; a first current generating circuit generating a first current based on the write current flowing through the memory cell; a second current generating circuit generating a second current based on the write current flowing through the memory cell; a hold circuit holding a first value generated based on the second current when the memory cell stores the first resistance value; a comparator comparing the first value with a second value generated based on a change of the first current while the memory cell changes from the first resistance value to the second resistance value; and a write current control circuit cutting off the write current based on a result of comparison of the comparator.

Embodiments will be described hereinafter with reference to the accompanying drawings.

One of the embodiments hereinafter explained is applied to a nonvolatile memory in which a write operation is executed by flowing a write current to a memory cell, for example, a nonvolatile semiconductor memory in which a memory cell array comprises a plurality of cell units and each cell unit comprises a memory cell and an access transistor connected in series.

The memory cell is an element which stores data. For example, the memory cell comprises a resistance change element such as a magnetoresistive element, a phase change element or the like. The access transistor is an element which selects one o a plurality of rows in the memory cell array. For example, the access transistor comprises a field effect transistor (FET) in which a gate is connected to a word line.

In such a nonvolatile memory, the following embodiments propose technology of varying a write pulse width for each memory cell, in response to the write property (i.e., a write pulse width necessary for the write) of the memory cell.

In general, conventionally, the write pulse width has been constant and set to be longer in accordance with a memory cell of a worst write property to prevent a write error. In this case, in a memory cell of a good write property, write is completed early, and a write current continues flowing after the write has been completed. Thus, reduction in power consumption at the write time is difficult.

However, if the write pulse width is variable for each memory cell, an optimum write pulse width can be set for each memory cell in accordance with the write property of the memory cell. In this case, a write current can be stopped immediately in all the memory cells after the write is completed, irrespective of the write property of the memory cell. The reduction in power consumption at the write time can be therefore attempted.

Incidentally, it should be exactly detected whether the write has been completed for each memory cell or not, to set the write pulse width to an optimum value for each memory cell.

For this reason, a write current flowing through a memory cell which is a target of data write and to which access is currently made is first monitored and then a detection value (current value/voltage value) is generated, in the following embodiments. In addition, it is determined whether the write has been completed or not, by comparing the detection value with a reference value (current value/voltage value).

Secondarily, the reference value is not a fixed value, and is generated based on the write current flowing through the memory cell, for each memory cell. This is because when the reference value is a fixed value, the reference value often does not function as a threshold value due to variation of "0"/"1" resistance value in the memory cell, noise resulting from the wiring resistance/capacity, and the like.

For example, the reference value is generated based on the write current flowing through the memory cell, after the write current starts flowing through the memory cell and before the resistance value of the memory cell is varied (i.e., before the write is completed). In other words, when the write current reaches a first stable value after the write current starts flowing through the memory cell, the reference value is generated based on the first stable value.

In addition, if the write current continues flowing through the memory cell after the reference value is generated, the write current flowing through the memory cell is varied from the first stable value to a second stable value, since the resistance value of the memory cell is varied, i.e., since the write is completed. Since this variation is represented as variation of the detection value, it is determined whether the write has been completed or not, by comparing the detection value with the reference value, as explained above.

Thus, it can be detected whether the write has been completed or not, by setting the reference value at a middle value between the cell current (detection value) flowing through the memory cell before completion of the write and the cell current (detection value) flowing through the memory cell after completion of the write, at any time, irrespective of the memory cell.

[Overall Configuration]

FIG. 1 shows major portions of a nonvolatile memory.

A memory cell array 11 comprises an array of a plurality of cell units CU. Each of the plurality of cell units CU comprises, for example, a memory cell and an access transistor which are connected in series with each other. In this arrangement, i word lines WL0, WL1, . . . , WL(i−1) are connected to, for example, control terminals of the access transistors, i being a natural number larger than or equal to 2.

A word line driver 12 is connected to one of ends of each of i word lines WL0, WL1, . . . , WL(i−1). The word line driver 12 selects one of i word lines WL0, WL1, . . . , WL(i−1), i.e., one of a plurality of rows in the memory cell array 11, based on the address signal.

In this arrangement, j write circuits 13a-0, 13a-1, . . . , 13a-(j−1) are provided to correspond to a plurality of columns, j being a natural number larger than or equal to 2. The write circuits 13a-0, 13a-1, . . . 13a-(j−1) are connected to bit line pairs BL0, bBL0, BL1, bBL1, . . . , BL(j−1), bBL(j−1), respectively. In the present embodiment, one write circuit 13a-x (where x is in the range 1 to (j−1)) is provided for one column but, instead, one write circuit 13a-x may be provided for a plurality of columns.

Each of the write circuits 13a-0, 13a-1, . . . 13a-(j−1) comprises a write driver which generates a write current to change a first resistance value to a second resistance value in a memory cell inside the cell unit CU. However, if the memory cell is capable of storing a binary value, the first and second resistance values are resistance values different from each other. If the memory cell is capable of storing a multiple value larger than or equal to three, each of the first and second resistance values is one of at least three resistance values.

Similarly, number j of write circuits 13b-0, 13b-1, . . . , 13b-(j−1) are provided to correspond to a plurality of columns. The write circuits 13b-0, 13b-1, . . . , 13b-(j−1) are connected to bit line pairs BL0, bBL0, BL1, bBL1, . . . , BL(j−1), bBL(j−1), respectively. In the present embodiment, one write circuit 13b-y (where y is in the range 1 to (j−1)) is provided for one column but, instead, one write circuit 13b-y may be provided for a plurality of columns.

The write circuits 13b-0, 13b-1, . . . , 13b-(j−1) comprise write sinkers which absorb write currents generated by the write circuits 13a-0, 13a-1, . . . , 13a-(j−1), respectively.

A control circuit 16 generates a first write enable signal WE and a hold signal HOLD. The first write enable signal WE is supplied commonly to all the write circuits 13a-0, 13a-1, . . . , 13a-(j−1) in the nonvolatile semiconductor memory (chip). The hold signal HOLD determines a sampling point to obtain a reference value.

The first write enable signal WE and the hold signal HOLD are input to write current control circuits (C) 14-0, 14-1, . . . , 14-(j−1).

The write current control circuits (C) 14-0, 14-1, . . . 14-(j−1) generate second write enable signals WE0, WE1, . . . , WE(j−1) and stop the write currents flowing through the memory cells in the cell units CU by the second write enable signals WE0, WE1, . . . , WE(j−1), based on the first write enable signal WE and write stop signals Wstop0, Wstop1, . . . , Wstop(j−1).

The first write enable signal WE determines a longest period in which the write currents can be made to flow through the memory cells in the cell units CU. As explained above, however, the write property of the memory cells is generally varied in each memory cell. Thus, the second write enable signals WE0, WE1, . . . , WE(j−1) obtained by abbreviating the first write enable signal WE are generated in accordance with the write property of the memory cells.

The second write enable signals WE0, WE1, . . . , WE(j−1) and write data elements DATA0, DATA1, . . . , DATA(j−1) are input to the write circuits 13a-0, 13a-1, . . . , 13a-(j−1), respectively. In addition, the write data elements DATA0, DATA1, . . . , DATA(j−1) are input to the write circuits 13a-0, 13a-1, . . . , 13a-(j−1), respectively.

Write current detection circuits (D) 15-0, 15-1, . . . , 15-(j−1) generate the write stop signals Wstop0, Wstop1, . . . , Wstop(j−1), respectively, based on the cell currents flowing to the cell units CU currently accessed, i.e., the cell currents flowing to the write circuits 13a-0, 13a-1, . . . , 13a-(j−1). The write stop signals Wstop0, Wstop1, . . . , Wstop(j−1) are input to the write current control circuits (C) 14-0, 14-1, . . . , 14-(j−1), respectively.

In the following explanations, the write data elements DATA0, DATA1, . . . , DATA(j−1) are defined as follows, to simplify the explanations. However, the definition is made to make the explanations comprehensible, and each of the embodiments is not limited to the definition.

The memory cell (resistance change element) is assumed to be capable of storing data in a high resistance state ("0" state) and a low resistance state ("1" state).

The "0" write indicates that the write data elements DATA0, DATA1, . . . , DATA(j−1) are "0". The "0" write is an operation of changing the low resistance state to the high resistance state, of the resistance value of the memory cell.

The "1" write indicates that the write data elements DATA0, DATA1, . . . DATA(j−1) are "1". The "1" write is an operation of changing the high resistance state to the low resistance state, of the resistance value of the memory cell.

In addition, it is assumed that "0" corresponds to "L (low level)" of the logic and that "1" corresponds to "H (high level)" of the logic.

[Write Current Control Circuit]

FIG. 2A shows an example of the write current control circuit.

First, the write circuits 13a-0 and 13b-0, and the cell unit CU will be explained as a premise of explanation.

The write circuit 13a-0 comprises a P-channel FET T0 and a write driver 21. The P-channel FET T0 generates a write current Iw(t). The write driver 21 supplies the write current Iw(t) to the memory cell MC when the second write enable signal WE0 is at "1" (high level).

In addition, the write circuit 13a-0 comprises switch elements SWa and SWb. When the write data DATA0 is at "0" (low level), the switch element SWa is turned on and the switch element SWb is turned off. When the write data DATA0 is at "1" (high level), the switch element SWa is turned off and the switch element SWb is turned on.

Each of the switch elements SWa and SWb comprises, for example, a P-channel FET.

The write circuit 13b-0 comprises switch elements SWc and SWd. When the write data DATA0 is at "0" (high level), the switch element SWc is turned off and the switch element SWd is turned on. When the write data DATA0 is at "1" (high level), the switch element SWc is turned on and the switch element SWd is turned off.

Each of the switch elements SWc and SWd comprises, for example, an N-channel FET.

bDATA is an inverted signal of DATA.

The cell unit CU is connected between the bit line pairs BL0 and bBL, and comprises the memory cell MC and the access transistor AT that are connected in series. rcell is a resistance value of the memory cell MC.

The memory cell MC is, for example, a 2-terminal element, which is a resistance change element having a resistance value varied by the write current (bidirectional current). The access transistor AT is, for example, a FET comprising a gate (control terminal), a source and a drain. The gate of the access transistor AT is connected to the word line WL0.

Under such a precondition, the write current control circuit 14-0 generates the second write enable signal WE0 obtained by abbreviating the first write enable signal WE, stops the write current Iw(t) flowing through the memory cell MC by the second write enable signal WE0, based on the write stop signal Wstop0.

For this reason, the write current control circuit 14-0 comprises, for example, an exclusive-NOR circuit Ex-NOR and an AND circuit AND1.

The write data DATA0 and the write stop signal Wstop0 are input to the exclusive-NOR circuit Ex-NOR.

For example, when the write data DATA0 is at "0" (low level), the write current detection circuit 15-0 does not output the write stop signal Wstop0 before the write is completed. In other words, the write stop signal Wstop0 is at "0". An output signal of the exclusive-NOR circuit Ex-NOR is therefore at "1" (high level).

When the first write enable signal WE is at "1", the write driver 21 becomes in an operative state and the write current Iw(t) flows since the second write enable signal WE0 also becomes "1".

In addition, the write current detection circuit 15-0 outputs the write stop signal Wstop0 after the write is completed. In other words, the write stop signal Wstop0 is at "1". The output signal of the exclusive-NOR circuit Ex-NOR therefore transitions from "1" to "0".

Even if the first write enable signal WE is at "1", the second write enable signal WE0 transitions from "1" to "0", the write driver 21 becomes in an inoperative state and the write current Iw(t) stops.

In contrast, when the write data DATA0 is at "1", the write current detection circuit 15-0 does not output the write stop signal Wstop0 before the write is completed. In other words, the write stop signal Wstop0 is at "1" (it should be noted that the signal is logically opposite to a case where the write data DATA0 is at "0"). The output signal of the exclusive-NOR circuit Ex-NOR is therefore at "1".

When the first write enable signal WE is at "1", the write driver 21 becomes in an operative state and the write current Iw(t) flows since the second write enable signal WE0 also becomes "1".

In addition, the write current detection circuit 15-0 outputs the write stop signal Wstop0 after the write is completed. In other words, the write stop signal Wstop0 is at "0". The output signal of the exclusive-NOR circuit Ex-NOR therefore transitions from "1" to "0".

Even if the first write enable signal WE is at "1", the second write enable signal WE0 transitions from "1" to "0", the write driver 21 becomes in an inoperative state and the write current Iw(t) stops.

FIG. 2B shows another example of the write current control circuit.

In this example, a logic circuit in which the write stop signal Wstop0 is asserted after a sampling point to obtain a reference value is added.

Thus, even if the write stop signal Wstop0 is output before the reference value is confirmed, i.e., before the sampling point, this is neglected.

For this reason, an AND circuit AND2 and an OR circuit OR are further provided in the write current control circuit 14-0 in this example.

When the first write enable signal WE is at "0", the second write enable signal WE0 is also at "0". The write driver 21 is therefore in an inoperative state.

The hold signal HOLD is at "0" and an inverted signal bHOLD of the hold signal HOLD is at "1", before the sampling point. For this reason, an output signal of the AND circuit AND2 is "0" and an output signal of the OR circuit OR is "1", irrespective of the output signal of the exclusive-NOR circuit Ex-NOR. Thus, when the first write enable signal WE becomes "1", the second write enable signal WE0 also becomes "1". As a result, the write driver 21 becomes an operative state and the write current flows.

The hold signal HOLD transitions from "0" to "1" at the sampling point.

The hold signal HOLD is at "1" and the inverted signal bHOLD of the hold signal HOLD is at "0", after the sampling point. For this reason, the output signal of the AND circuit AND2 transitions in accordance with the output signal of the exclusive-NOR circuit Ex-NOR. In addition, the OR circuit outputs the output signal of the AND circuit AND2 as it is.

For example, when the write data DATA0 is at "0" and the write stop signal Wstop0 from the write current detection circuit 15-0 is at "0" (before the write is completed), the output signal of the exclusive-NOR circuit Ex-NOR is "1". For this reason, the output signal of the AND circuit AND2 is "1" and the output signal of the OR circuit OR is also "1". The second write enable signal WE0 is also at "1". As a result, the write driver 21 is in an operative state and the write current continues flowing.

In contrast, when the write data DATA0 is at "0" and the write stop signal Wstop0 from the write current detection circuit 15-0 is at "1" (after the write is completed), the output signal of the exclusive-NOR circuit Ex-NOR is "0". For this reason, the output signal of the AND circuit AND2 is "0" and the output signal of the OR circuit OR is also "0". The second write enable signal WE0 is also at "0". As a result, the write driver 21 becomes an inoperative state and the write current stops.

In addition, when the write data DATA0 is at "1" and the write stop signal Wstop0 from the write current detection circuit 15-0 is at "1" (before the write is completed), the output signal of the exclusive-NOR circuit Ex-NOR is "1". For this reason, the output signal of the AND circuit AND2 is "1" and the output signal of the OR circuit OR is also "1". The second write enable signal WE0 is also at "1". As a result, the write driver 21 is in an operative state and the write current continues flowing.

In contrast, when the write data DATA0 is at "1" and the write stop signal Wstop0 from the write current detection circuit 15-0 is at "0" (after the write is completed), the output signal of the exclusive-NOR circuit Ex-NOR is "0". For this reason, the output signal of the AND circuit AND2 is "0" and the output signal of the OR circuit OR is also "0". The second write enable signal WE0 is also at "0". As a result, the write driver 21 becomes an inoperative state and the write current stops.

Example of Write Current Detection Circuit

Figure 3:
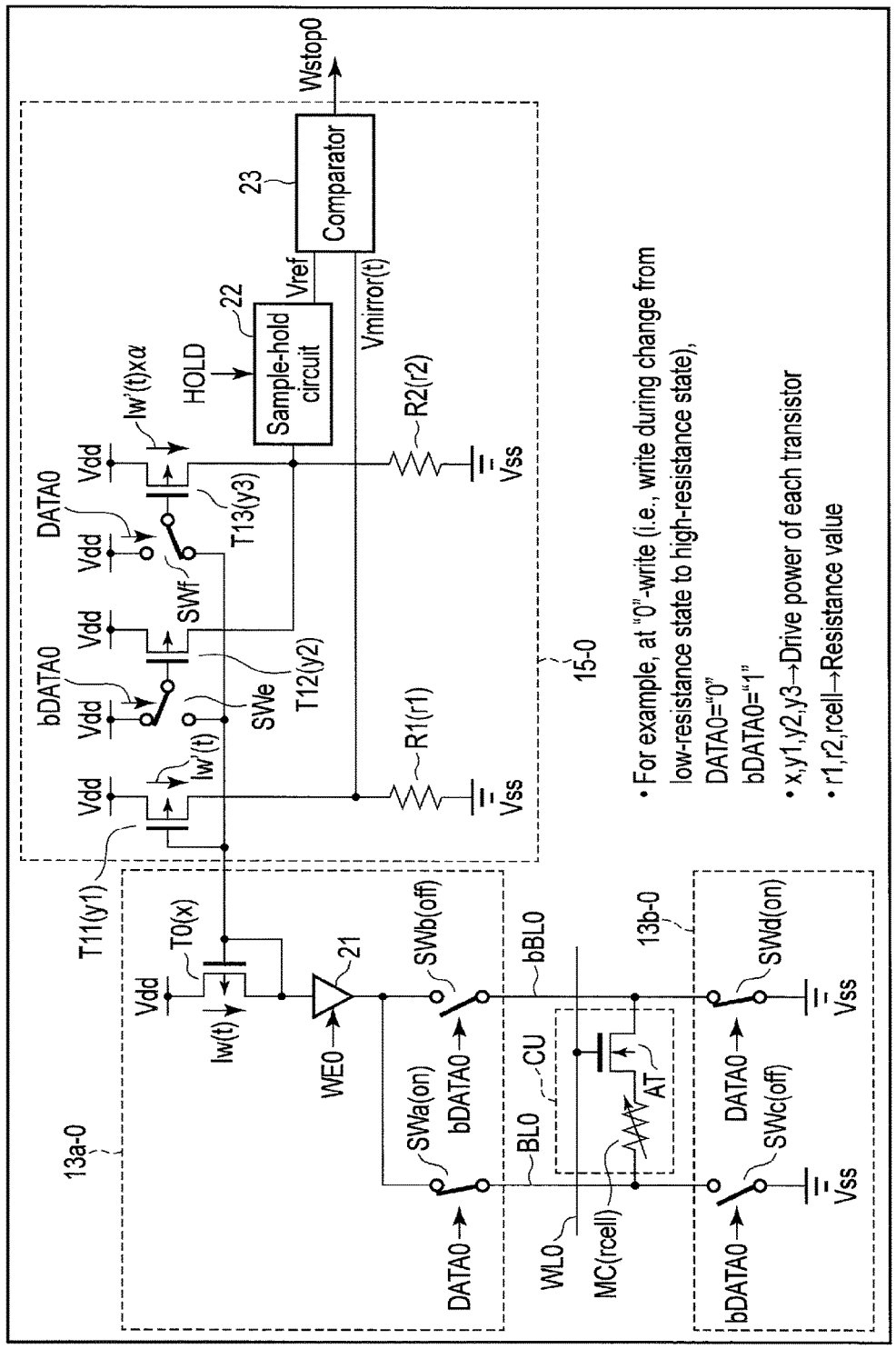
FIG. 3 is a block diagram showing an example of a write current detection circuit at "0"-write.

FIG. 3 shows an example of the write current detection circuit at "0"-write.

The write circuits 13a-0 and 13b-0, and the cell unit CU are the same as those in the above-explained example of the write current control circuit. In other words, the second write enable signal WE0 in FIG. 3 corresponds to the second write enable signal WE0 in FIG. 2A or FIG. 2B.

First, the write current detection circuit 15-0 generates a detection value Vmirror(t) based on the write current Iw(t) flowing through the memory cell MC. (t) of Iw(t) and Vmirror(t) indicates that the write current and the detection value are varied with time t.

Figure 4:
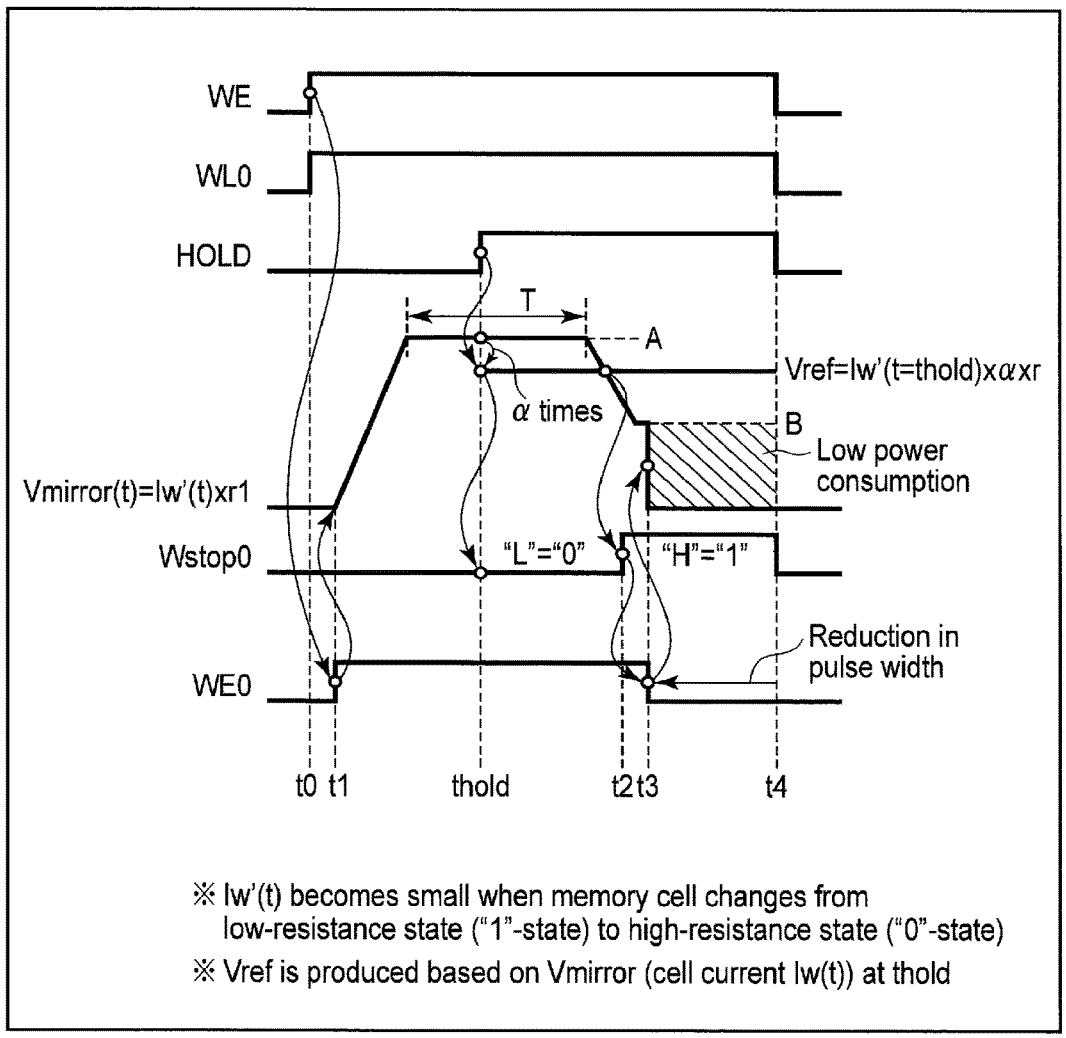
FIG. 4 is a graph showing operational waveforms of the circuit shown in FIG. 3.

As shown in FIG. 4, for example, the first write enable signal WE and the second write enable signal WE0 become high level at time t0 and, when the word line WL0 becomes high level, the write current Iw(t) starts flowing through the memory cell MC at time t1. In FIG. 4, rise timing of the first write enable signal WE and the second write enable signal WE0, and rise timing of the word line WL0 are the same as each other but may be different from each other.

The write current detection circuit 15-0 comprises a current mirror circuit which copies the write current Iw(t). The current mirror circuit comprises a P-channel FET T11, which corresponds to the P-channel FET T0 flowing the write current Iw(t). However, a size ratio (drive power ratio) between the two P-channel FETs T0 and T11 is T0:T11=x: y1. x and y1 may be the same (T0:T11=1:1) or different from each other.

The P-channel FET T11 generates a copy current Iw'(t) following the write current Iw(t) in real time. (t) of Iw'(t) indicates that the copy current is varied with time t.

For example, the copy current Iw'(t) is converted into a voltage by the resistive element R1. The voltage becomes the detection value Vmirror(t) and is input to the comparator 23. However, Iw'(t) is equal to (y1/x)×Iw(t) and Vmirror(t) is equal to Iw'(t)×r1, and r1 is the resistance value of the resistive element R1.

Next, the write current detection circuit 15-0 generates the reference value, based on the write current Iw(t) flowing through the memory cell MC, at the sampling point, after the write current Iw(t) starts flowing through the memory cell MC and before the resistance value of the memory cell MC is varied.

As shown in FIG. 4, for example, a sampling point thold is set in a period T between the time when the write current Iw(t) reaches a first stable value (initial stable value) A and the time when the resistance value of the memory cell MC is varied. Since the memory cell MC has a resistance state which is made before the write is completed or the low-resistance state ("1"-state) in the present example, at the first stable value (period T), the write current Iw(t) has a large value.

For this reason, a reference value Vref which is a threshold value to detect the time when the write current Iw(t) is varied from a large value to a small value, is generated based on the write current Iw(t) flowing through the memory cell MC, at the sample point thold.

For this reason, the write current detection circuit 15-0 comprises a current mirror circuit which copies the write current Iw(t). The current mirror circuit comprises a P-channel FET T13, which corresponds to the P-channel FET T0 flowing the write current Iw(t). However, a size ratio (drive power ratio) between the two P-channel FETs T0 and T13 is T0:T13=x:y3. In addition, y3 is smaller than x. In addition, the switch element SWf connects the gate of the P-channel FET T13 to the gate of the P-channel FET T0, based on the write data DATA0 (="0").

The P-channel FET T13 generates a copy current Iw'(t)×α following the write current Iw(t) in real time. α depends on the size ratio (drive power ratio) between the two P-channel FETs T0 and T13 and is y3/x. For example, α is set to be a value smaller than 1, for example, 0.8 to detect the time at which the memory cell MC is varied from the low-resistance state ("1"-state) to the high-resistance state ("0"-state), i.e., the time at which the write current Iw(t) is varied from a large value to a small value.

In addition, the copy current Iw'(t)×α is converted into a voltage by a resistive element R2. The voltage is input to the sample-hold circuit 22. The sample-hold circuit 22 holds the voltage at the sampling point thold, i.e., the time at which the hold signal HOLD transitions from the low level to the high level.

The voltage held in the sample-hold circuit 22 becomes the reference value Vref. The reference value Vref is input to the comparator 23. However, Vref is equal to Iw'(t=thold)× α×r2, and r2 is the resistance value of the resistive element R2. (t=thold) of Tw'(t=thold) indicates a value of the copy current at time t=thold.

In addition, the reference value Vref is confirmed and the output (write stop signal Wstop0) of the comparator 23 is reset at low level, at the sampling point thold.

Lastly, the write current detection circuit 15-0 outputs the write stop signal Wstop0 when the detection value Vmirror (t) crosses the reference value Vref.

As shown in FIG. 4, for example, when the memory cell MC is varied from the low-resistance state ("1"-state) to the high-resistance state ("0"-state), by the write current Iw(t), Vmirror(t) is varied from a first stable value A to a second stable value B. Thus, write completion in a "0"-write operation can be determined by detecting the time at which the detection value Vmirror(t) becomes smaller than the reference value Vref, by the comparator 23.

The comparator 23 outputs the write stop signal Wstop0 at time t2 after the write is completed. In the present example, the write stop signal Wstop0 is at the high level. Since the write stop signal Wstop0 is fed back to the write current control circuit (FIG. 2A or FIG. 2B), the second write enable signal WE0 becomes at the low level at time t3. The write current Iw(t) therefore stops.

The pulse width of the first write enable signal WE is set to be longer from time t0 to time t4 so as to enable the writing to be executed in a memory cell of a worst write property. In contrast, according to the present example, as explained above, the pulse width of the second write enable signal WE0 can be set to be shorter from time t0 to time t3 when write in the memory cell MC is completed early. In other words, the present example can contribute to low power consumption since the write current occurring in the period between time t3 and time t4 can be extinguished.

In the present example, the reference value (threshold value) to determine the write completion is generated based on the write current flowing through the memory cell which is currently accessed (before the write completion).

In addition, in the present example ("0"-write), the write current Iw(t) flowing through the memory cell MC is varied from a large value to a small value. For this reason, the reference value Vref needs to be obtained from the write current Iw(t), i.e., a large value.

In contrast, in "1"-write, the write current Iw(t) flowing through the memory cell MC is varied from a small value to a large value. For this reason, the reference value Vref needs to be obtained from the write current Iw(t), i.e., a small value.

In other words, a current mirror circuit which generates the reference value Vref at "1"-write needs to be provided separately from the current mirror circuit which generates the reference value Vref at "0"-write.

For this reason, the write current detection circuit 15-0 further comprises a P-channel FET T12 and a switch element SWe. The P-channel FET T12 is a current mirror circuit which generates a reference value Vrer at "1"-write. Similarly to the present example, the switch element SWe connects a gate of the P-channel FET T12 to a power supply terminal Vdd, at "0"-write. In other words, the P-channel FET T12 is in the OFF state, at "0"-write.

FIG. 5 shows an example of the write current detection circuit at "1"-write.

The write circuits 13a-0 and 13b-0, and the cell unit CU are the same as those in the above-explained example of the write current control circuit. In other words, a second write enable signal WE0 in FIG. 5 corresponds to the second write enable signal WE0 in FIG. 2A or FIG. 2B.

In addition, the write current detection circuit 15-0 is the same as that in FIG. 3 with respect to the feature that the P-channel FET T11 and the resistive element R1 are provided to generate the detection value Vmirror(t) based on the write current Iw(t) flowing through the memory cell MC.

Figure 6:
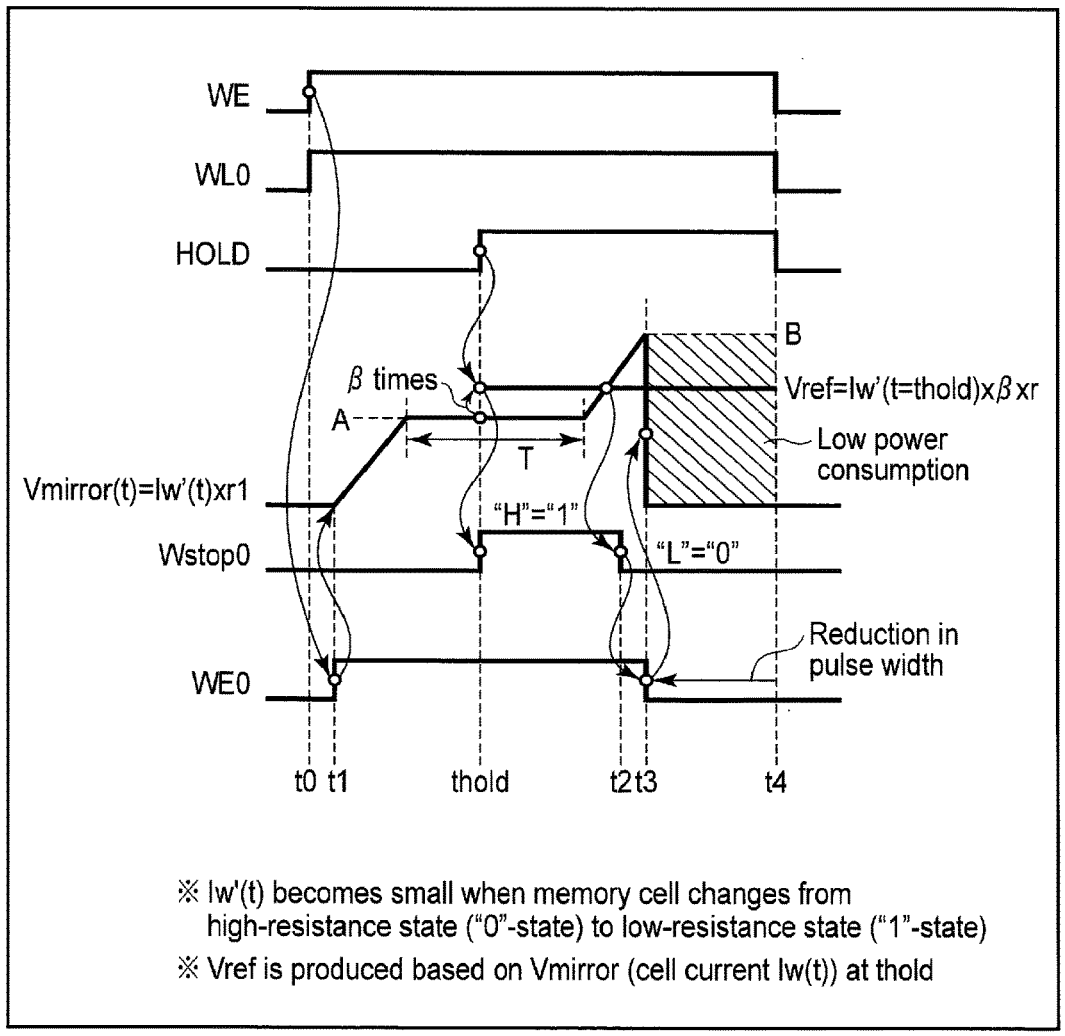
FIG. 6 is a graph showing operational waveforms of the circuit shown in FIG. 5.

As shown in FIG. 6, for example, the first write enable signal WE and the second write enable signal WE0 become high level at time t0 and, when the word line WL0 becomes high level, the write current Iw(t) starts flowing through the memory cell MC at time t1.

The P-channel FET T11 generates a copy current Iw'(t) following the write current Iw(t) in real time. For example, the copy current Iw'(t) is converted into a voltage by the resistive element R1. The voltage becomes the detection value Vmirror(t) and is input to the comparator 23. However, Iw'(t) is equal to (y1/x)×Iw(t) and Vmirror(t) is equal to Iw'(t)×r1, and r1 is the resistance value of the resistive element R1.

Next, the write current detection circuit 15-0 generates the reference value, based on the write current Iw(t) flowing through the memory cell MC, at the sampling point, after the write current Iw(t) starts flowing through the memory cell MC and before the resistance value of the memory cell MC is varied.

As shown in FIG. 6, for example, the sampling point thold is set in the period T between the time when the write current Iw(t) reaches the first stable value (initial stable value) A and the time when the resistance value of the memory cell MC is varied. Since the memory cell MC has a resistance state which is made before the write is completed or the high-resistance state ("0"-state) in the present example, at the first stable value (period T), the write current Iw(t) has a small value.

For this reason, the reference value Vref which is a threshold value to detect the time when the write current Iw(t) is varied from a small value to a large value, is generated based on the write current Iw(t) flowing through the memory cell MC, at the sample point thold.

For this reason, the write current detection circuit 15-0 comprises a current mirror circuit which copies the write current Iw(t). The current mirror circuit comprises a P-channel FET T12, which corresponds to the P-channel FET T0 flowing the write current Iw(t). However, a size ratio (drive power ratio) between the two P-channel FETs T0 and T12 is T0:T12=x:y2. In addition, y2 is larger than x. In addition, a switch element SWe connects a gate of a P-channel FET T12 to the gate of the P-channel FET T0, based on inverted data bDATA (="0") of the write data DATA0 (="1").

The P-channel FET T12 generates a copy current Iw'(t)×β following the write current Iw(t) in real time. However, β depends on the size ratio (drive power ratio) between the two P-channel FETs T0 and T12 and is y2/x. For example, β is set to be a value larger than 1, for example, 1.2 to detect the time at which the memory cell MC is varied from the high-resistance state ("0"-state) to the low-resistance state ("1"-state), i.e., the time at which the write current Iw(t) is varied from a small value to a large value.

In addition, the copy current Iw'(t)×β is converted into a voltage by the resistive element R2. The voltage is input to the sample-hold circuit 22. The sample-hold circuit 22 holds the voltage at the sampling point thold, i.e., the time at which the hold signal HOLD transitions from the low level to the high level.

The voltage held in the sample-hold circuit 22 becomes the reference value Vref. The reference value Vref is input to the comparator 23. However, Vref is equal to Iw'(t=thold)×β×r2, and r2 is the resistance value of the resistive element R2.

In addition, the reference value Vref is confirmed and the output (write stop signal Wstop0) of the comparator 23 is reset at high level, at the sampling point thold.

Lastly, the write current detection circuit 15-0 outputs the write stop signal Wstop0 when the detection value Vmirror (t) crosses the reference value Vref.

As shown in FIG. 6, for example, when the memory cell MC is varied from the high-resistance state ("0"-state) to the low-resistance state ("1"-state), by the write current Iw(t), Vmirror(t) is varied from the first stable value A to the second stable value B. Thus, write completion in a "1"-write operation can be determined by detecting the time at which the detection value Vmirror(t) becomes larger than the reference value Vref, by the comparator 23.

The comparator 23 outputs the write stop signal Wstop0 at time t2 after the write is completed. In the present example, the write stop signal Wstop0 is at the low level. Since the write stop signal Wstop0 is fed back to the write current control circuit (FIG. 2A or FIG. 2B), the second write enable signal WE0 becomes at the low level at time t3. The write current Iw(t) therefore stops.

The pulse width of the first write enable signal WE is set to be longer from time t0 to time t4. In contrast, according to the present example, as explained above, the pulse width of the second write enable signal WE0 can be set to be shorter from time t0 to time t3 when write in the memory cell MC is completed early. In other words, the present example can contribute to low power consumption since the write current occurring in the period between time t3 and time t4 can be extinguished.

The write current detection circuit 15-0 further comprises a P-channel FET T13 and a switch element SWf. As shown in FIG. 3 and FIG. 4, the P-channel FET T13 is a current mirror circuit which generates the reference value Vrer at "0"-write. Similarly to the present example, the switch element SWf connects the gate of the P-channel FET T13 to the power supply terminal Vdd, at "1"-write. In other words, the P-channel FET T13 is in the OFF state, at "1"-write.

Modified Example of Write Current Detection Circuit

FIG. 7 to FIG. 10 show a modified example of the write current detection circuit.

Figure 7:
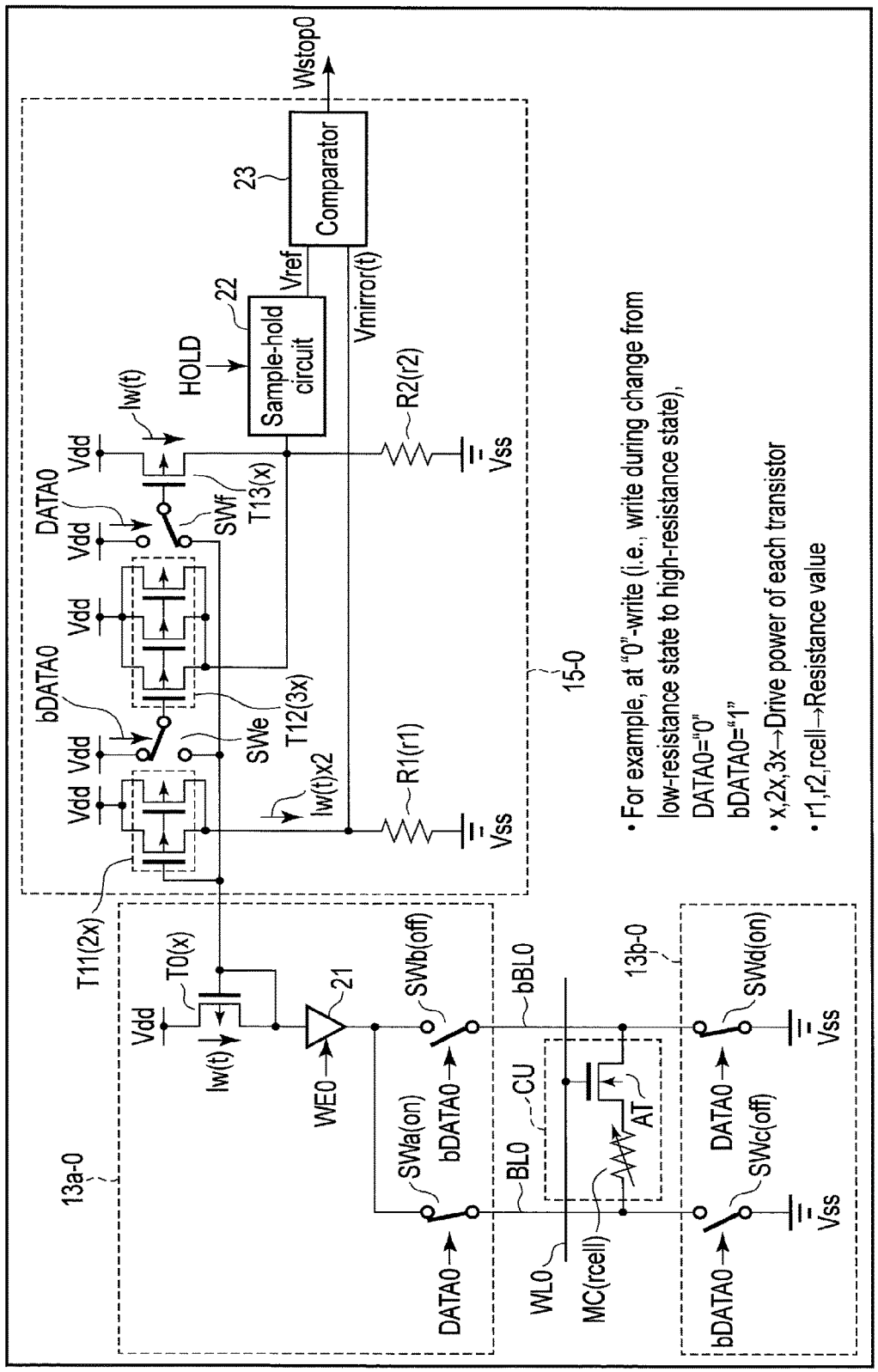
FIG. 7 is a block diagram showing a modified example of the write current detection circuit at "0"-write.
Figure 8:
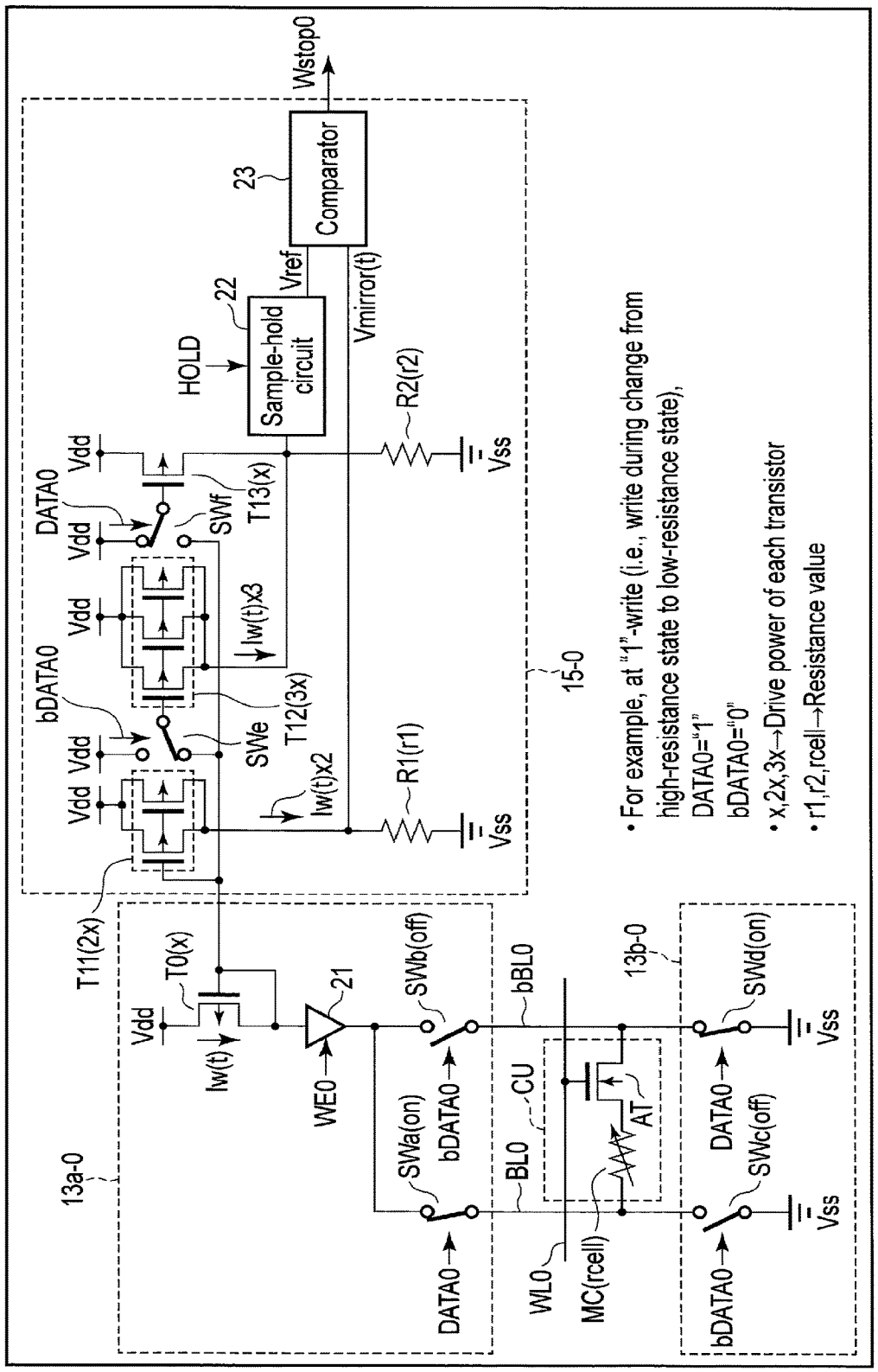
FIG. 8 is a block diagram showing a modified example of the write current detection circuit at "1"-write.

In the example shown in FIG. 7 and FIG. 8, the ratio (current mirror ratio) of the write current (cell current) to the copy current is adjusted based on the number of transistors (FET). However, all the transistors in the write circuit 13a-0 and the write current detection circuit 15-0 have the same size (the same drive power).

FIG. 7 corresponds to FIG. 3, and FIG. 8 corresponds to FIG. 5. Elements in FIG. 7 and FIG. 8 like or similar to those shown in FIG. 3 and FIG. 5 are denoted by the same reference numbers and symbols, and detailed explanations are omitted.

When the P-channel FET T0 which generates the write current Iw(t) comprises a transistor and its size (drive power) is x, the P-channel FET T11 comprises two transistors and their size (drive power) is set at 2x, for example. In addition, P-channel FET T12 comprises three transistors and their size (drive power) is set at 3x. Furthermore, the P-channel FET T13 comprises a transistor and its size (drive power) is set at x.

As shown in FIG. 7, the P-channel FET T11 generates a copy current Iw(t)×2 following the write current Iw(t) in real time, at "0"-write. The copy current Iw(t)×2 is converted into a voltage by the resistive element R1. The voltage becomes the detection value Vmirror(t) and is input to the comparator 23. However, Vmirror(t) is equal to Iw(t)×2×r1, and r1 is the resistance value of the resistive element R1.

In addition, the switch element SWf connects the gate of the P-channel FET T13 to the gate of the P-channel FET T0, based on the write data DATA0 (="0"). The P-channel FET T13 generates the copy current Iw(t) following the write current Iw(t) in real time. The copy current Iw(t) is converted into a voltage by the resistive element R2.

The voltage is input to the sample-hold circuit 22. The sample-hold circuit 22 holds the voltage at the sampling point thold, i.e., the time at which the hold signal HOLD transitions from the low level to the high level.

The voltage held in the sample-hold circuit 22 becomes the reference value Vref. The reference value Vref is input to the comparator 23. However, Vref is equal to Iw(t=thold)×r2, and r2 is the resistance value of the resistive element R2.

In addition, the reference value Vref is confirmed and the output (write stop signal Wstop0) of the comparator 23 is reset at low level, at the sampling point thold.

The switch element SWe connects the gate of the P-channel FET T12 to the power supply terminal Vdd, at "0"-write. In other words, the P-channel FET T12 is in the OFF state, at "0"-write.

According to the present example, the reference value Vref=Iw(t=thold)×r2 can be controlled based on the number of transistors and the resistance values r1 and r2 of the resistive elements R1 and R2, such that the reference value becomes a value, for example, Vref=0.8×Vmirror(t≤thold), smaller than the detection value Vmirror(t≤thold)=Iw(t)×2×r1 made before the write completion.

In contrast, as shown in FIG. 8, the P-channel FET T11 generates the copy current Iw(t)×2 following the write current Iw(t) in real time, at "1"-write. The copy current Iw(t)×2 is converted into a voltage by the resistive element R1. The voltage becomes the detection value Vmirror(t) and is input to the comparator 23. However, Vmirror(t) is equal to Iw(t)×2×r1, and r1 is the resistance value of the resistive element R1.

In addition, the switch element SWe connects the gate of the P-channel FET T12 to the gate of the P-channel FET T0, based on inverted data bDATA (="0") of the write data DATA0. The P-channel FET T12 generates a copy current Iw(t)×3 following the write current Iw(t) in real time. The copy current Iw(t)×3 is converted into a voltage by the resistive element R2.

The voltage is input to the sample-hold circuit 22. The sample-hold circuit 22 holds the voltage at the sampling point thold, i.e., the time at which the hold signal HOLD transitions from the low level to the high level.

The voltage held in the sample-hold circuit 22 becomes the reference value Vref. The reference value Vref is input to the comparator 23. However, Vref is equal to Iw(t=thold)×3×r2, and r2 is the resistance value of the resistive element R2.

In addition, the reference value Vref is confirmed and the output (write stop signal Wstop0) of the comparator 23 is reset at high level, at the sampling point thold.

Similarly to the present example, the switch element SWf connects the gate of the P-channel FET T13 to the power supply terminal Vdd, at "1"-write. In other words, the P-channel FET T13 is in the OFF state, at "1"-write.

According to the present example, the reference value Vref=Iw(t=thold)×3×r2 can be controlled based on the number of transistors and the resistance values r1 and r2 of the resistive elements R1 and R2, such that the reference value becomes a value, for example, Vref=1.2×Vmirror(t≤thold), larger than the detection value Vmirror(t≤thold)=Iw(t)×2×r1 made before the write completion.

In the example shown in FIG. 7 and FIG. 8, a size ratio (drive power ratio) among the P-channel FETs T11, T12 and T13 is 2:3:1, but may be an arbitrary size ratio D11:D12:D13 instead.

Figure 9:
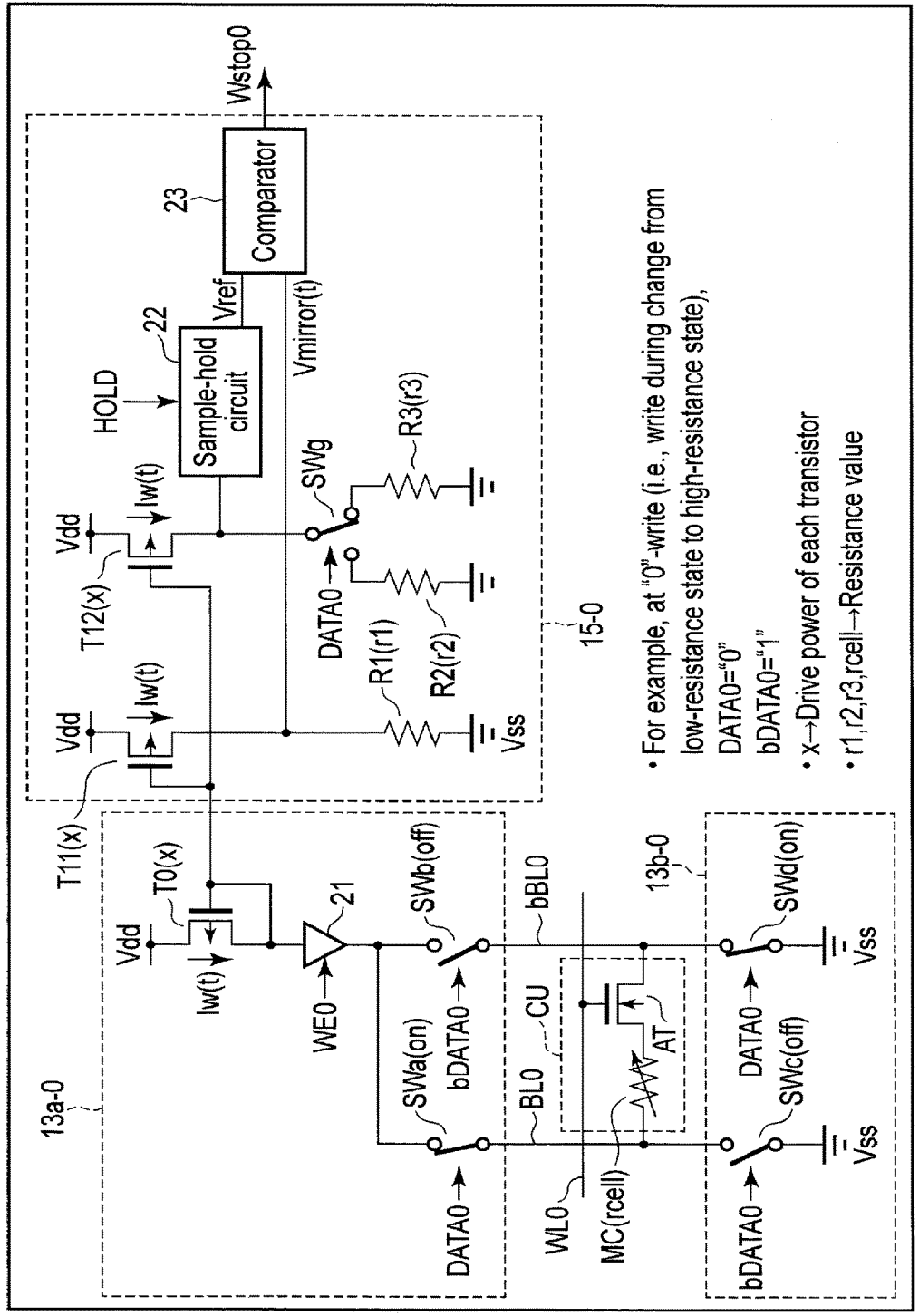
FIG. 9 is a block diagram showing a modified example of the write current detection circuit at "0"-write.
Figure 10:
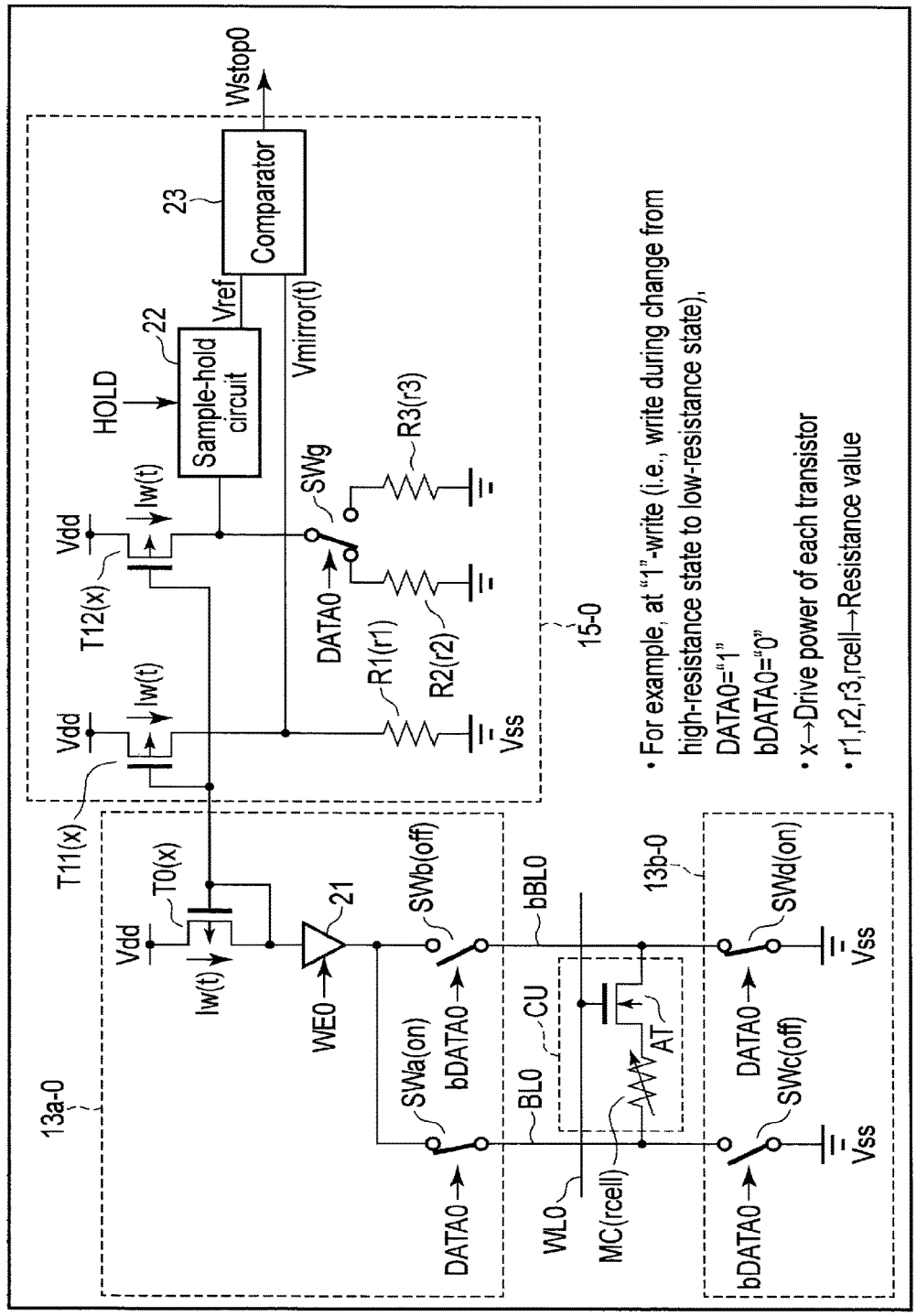
FIG. 10 is a block diagram showing a modified example of the write current detection circuit at "1"-write.

In the example shown in FIG. 9 and FIG. 10, the ratio between the copy current to generate the detection value and the copy current to generate the reference value is set such that the copy currents are the same as each other, and two types of reference values are generated based on the resistance value of the resistive element which converts the copy current into the voltage.

In the present example, too, all the transistors in the write circuit 13a-0 and the write current detection circuit 15-0 have the same size (the same drive power).

FIG. 9 corresponds to FIG. 3, and FIG. 10 corresponds to FIG. 5. Elements in FIG. 9 and FIG. 10 like or similar to those shown in FIG. 3 and FIG. 5 are denoted by the same reference numbers and symbols, and detailed explanations are omitted.

When the P-channel FET T0 which generates the write current Iw(t) comprises a transistor and its size (drive power) is x, each of the P-channel FETs T11 and T12 comprises a transistor and its size (drive power) is set at x.

As shown in FIG. 9, the P-channel FET T11 generates a copy current Iw(t) following the write current Iw(t) in real time, at "0"-write. The copy current Iw(t) is converted into a voltage by the resistive element R1. The voltage becomes the detection value Vmirror(t) and is input to the comparator 23. However, Vmirror(t) is equal to Iw(t)×r1, and r1 is the resistance value of the resistive element R1.

In addition, a switch element SWg serially connects a current path of the P-channel FET T12 to a resistive element R3, based on the write data DATA0 (="0"). The P-channel FET T12 generates a copy current Iw(t) following the write current Iw(t) in real time. The copy current Iw(t) is converted into a voltage by the resistive element R3.

The voltage is input to the sample-hold circuit 22. The sample-hold circuit 22 holds the voltage at the sampling point thold, i.e., the time at which the hold signal HOLD transitions from the low level to the high level.

The voltage held in the sample-hold circuit 22 becomes the reference value Vref. The reference value Vref is input to the comparator 23. However, Vref is equal to Iw(t=thold)×r3, and r3 is the resistance value of the resistive element R3.

In addition, the reference value Vref is confirmed and the output (write stop signal Wstop0) of the comparator 23 is reset at low level, at the sampling point thold.

According to the present example, the reference value Vref=Iw(t=thold)×r3 can be controlled based on the resistance values r1 and r3 of the resistive elements R1 and R3, such that the reference value becomes a value, for example, Vref=0.8×Vmirror(t≤thold), smaller than the detection value Vmirror(t≤thold)=Iw(t)×r1 made before the write completion.

In contrast, as shown in FIG. 10, the P-channel FET T11 generates the copy current Iw(t) following the write current Iw(t) in real time, at "1"-write. The copy current Iw(t) is converted into a voltage by the resistive element R1. The voltage becomes the detection value Vmirror(t) and is input to the comparator 23. However, Vmirror(t) is equal to Iw(t)×r1, and r1 is the resistance value of the resistive element R1.

In addition, the switch element SWg serially connects the current path of the P-channel FET T12 to the resistive element R2, based on the write data DATA0 (="1"). The P-channel FET T12 generates a copy current Iw(t) following the write current Iw(t) in real time. The copy current Iw(t) is converted into a voltage by the resistive element R2.

The voltage is input to the sample-hold circuit 22. The sample-hold circuit 22 holds the voltage at the sampling point thold, i.e., the time at which the hold signal HOLD transitions from the low level to the high level.

The voltage held in the sample-hold circuit 22 becomes the reference value Vref. The reference value Vref is input to the comparator 23. However, Vref is equal to Iw(t=thold)×r2, and r2 is the resistance value of the resistive element R2.

In addition, the reference value Vref is confirmed and the output (write stop signal Wstop0) of the comparator 23 is reset at high level, at the sampling point thold.

According to the present example, the reference value Vref=Iw(t=thold)×r2 can be controlled based on the resistance values r1 and r2 of the resistive elements R1 and R2, such that the reference value becomes a value, for example, Vref=1.2×Vmirror(t≤thold), larger than the detection value Vmirror(t≤thold)=Iw(t)×r1 made before the write completion.

In the example shown in FIG. 9 and FIG. 10, the size ratio (drive power ratio) between the P-channel FETs T11 and T12 is 1:1, but may be an arbitrary size ratio D11:D12 instead.

[Case where Write Data is the Same as Data of Memory Cell Obtained Before Write]

Write data (i.e., the resistance value of the memory cell obtained after write) is often the same as the data (resistance value) of the memory cell obtained before write since the data of the memory cell obtained before write generally cannot be recognized. This case will be hereinafter explained.

When the write data and the data of the memory cell obtained before write are "0", i.e., when the resistance value of the memory cell is in the high-resistance state before and after write, the reference value Vref is generated in accordance with the case shown in FIG. 3. In this case, the reference value Vref is a value obtained by multiplying the first stable value A shown in FIG. 6 by α (equivalent to α in FIG. 3 and FIG. 4). In this case, the detection value Vmirror(t) does not cross the reference value Vref.

Thus, the write current continues flowing in a general write period, for example, the period t0 to t4 in which the write enable signal WE is at high level in FIG. 4. However, since the data does not change before and after write, write is normally completed after the write current flows.

When the write data and the data of the memory cell obtained before write are "1", i.e., when the resistance value of the memory cell is in the low-resistance state before and after write, the reference value Vref is generated in accordance with the example shown in FIG. 5. In this case, the reference value Vref is a value obtained by multiplying the first stable value A shown in FIG. 4 by β (equivalent to β in FIG. 5 and FIG. 6). In this case, the detection value Vmirror(t) does not cross the reference value Vref.

Thus, the write current continues flowing in a general write period, for example, the period t0 to t4 in which the write enable signal WE is at high level in FIG. 6. However, since the data does not change before and after write, write is normally completed after the write current flows.

Since all the data elements of the memory cell obtained before write generally do not match the write data, the effect of lower power consumption can be obtained at each write operation, as compared with the prior art, in the present embodiment.

The present embodiment is capable of achieving the effect of lower power consumption by cooperation with the verify operation to verify whether write is completed or not, even in the above-explained case where the data does not change before and after write.

For example, data write is executed by a plurality of write operations, and the write period (i.e., the period t0 to t4 in FIG. 4 or FIG. 6) of the single write operation, i.e., the period in which the write enable signal WE is at the high level is shortened.

In this case, lower power consumption in the memory cell which quickly completes write (including a memory cell in which data does not change before and after write) can be attempted by executing no write operation after that. In addition, lower power consumption in the memory cell which slowly completes write (a memory cell alone in which data changes before and after write) can be attempted as compared with prior art, by applying the present embodiment.

In addition, in the present embodiment, a memory cell in which the data does not change before and after write may be assumed, and a read operation of confirming existing data written in the memory cell may be executed before executing the write operation.

In this case, if the write data is the same as the data of the memory cell obtained before write, the present embodiment is not applied and the write operation is not executed. In addition, if the write data is different from the data of the memory cell obtained before write, the write operation to which the present embodiment is applied is executed.

In the above case, too, the effect of lower power consumption can be achieved in the memory cell in which the data does not change before and after write.

[Application to Test Circuit]

The above-explained embodiment can be applied to a test circuit of a nonvolatile memory to be shipped. In a built-in test (BIST), for example, the write property or a good/bad quality of each memory cell in the nonvolatile memory can be determined based on the write period of the above-explained embodiment (i.e., the period in which the write current flows).

Then, the magnitude of the write pulse, the width of the write pulse (equivalent to the first write enable signal WE) and the like can be calibrated in accordance with, for example, the write property of each memory cell. In addition, redundancy replacement may also be executed based on a good/bad quality of each memory cell.

Example of Application

A processor employed in a portable information terminal is required to consume little energy. As one of methods for reducing the energy consumed by a processor, a cache memory based on a static random access memory (SRAM) requiring large standby power is replaced with a nonvolatile memory using a nonvolatile element.

In other words, leakage power of the SRAM tends to be larger both during operation and during standby (non-operation) as the transistor becomes smaller. For this reason, the power supply can be shut down during standby and the power consumption during standby can be reduced by replacing the cache memory with a nonvolatile memory.

For example, an attempt to implement a low-power processor by employing the magnetic random access memory (MRAM) as the cache memory is reviewed.

MRAM is a memory technology which can simultaneously acquire three features, i.e., high rewrite durability, operation performance of high-speed read/write, and cell area of high integration, in a currently proposed nonvolatile memory. For this reason, possibility of mounting a large-capacity, high-speed nonvolatile cache memory in a processor can be increased by employing MRAM as cache.

The above-explained embodiments are effective technologies to implement such a large-capacity, high-speed nonvolatile cache memory. An example of a low-power processor system to which the embodiments can be applied will be hereinafter explained.

Figure 11:
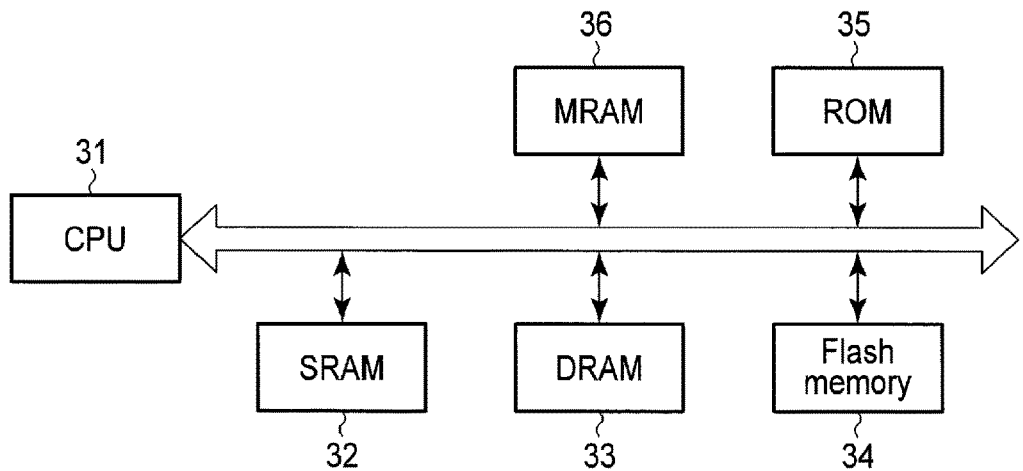
FIG. 11 is a block diagram showing an example of a nonvolatile cache system.

FIG. 11 shows an example of a low-power processor system.

A CPU 31 controls an SRAM 32, a DRAM 33, a flash memory 34, a ROM 45 and a magnetic random access memory (MRAM) 36.

The MRAM 36 can be used as a replacement for the SRAM 32, the DRAM 33, the flash memory 34 or the ROM 35. In accordance with this, at least any one of the SRAM 32, the DRAM 33, the flash memory 34 and the ROM 35 may be omitted.

The MRAM 36 can be used as a nonvolatile cache memory (for example, L2 cache).

Figure 12:
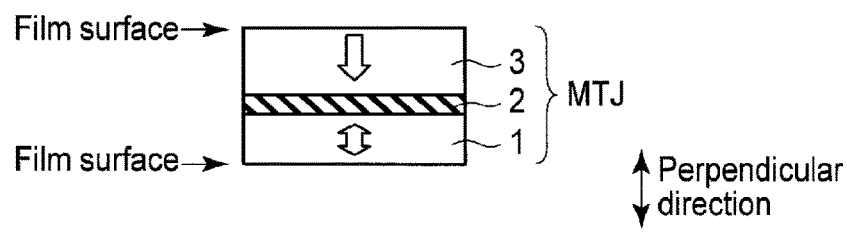
FIG. 12 and FIG. 13 are views showing examples of a magnetoresistive element.

FIG. 12 shows a basic structure of the magnetoresistive element.

A magnetoresistive element MTJ is an example of the memory cell in each of the above-explained embodiments. The magnetoresistive element MTJ has a multilayered structure in which a storage layer (ferromagnetic layer) 1 having perpendicular and variable magnetization, a tunnel barrier layer (nonmagnetic layer) 2, and a reference layer (ferromagnetic layer) 3 having perpendicular and fixed magnetization are disposed in this order in a direction perpendicular to a film surface.

Fixed magnetization means that the direction of magnetization is not changed before and after write, and variable magnetization means that the direction of magnetization can be changed oppositely before and after write.

In addition, write indicates spin transfer writing which supplies a spin torque to the magnetization of the storage layer 1 by allowing a spin implantation current (spin-polarized electrons) to flow to the magnetoresistive element MTJ.

For example, when the spin implantation current is made to flow from the storage layer 1 toward the reference layer 3, the direction of magnetization of the storage layer 1 becomes the same as the direction of magnetization of the reference layer 3 (parallel state) since the spin-polarized electrons are implanted into the storage layer 1 in the same direction as the magnetization of the reference layer 3 to supply a spin torque to the magnetization inside the storage layer 1.

In addition, when the spin implantation current is flown from the reference layer 3 toward the storage layer 1, the direction of magnetization of the storage layer 1 becomes opposite to the direction of magnetization of the reference layer 3 (antiparallel state) since electrons spin-polarized in a direction opposite to the magnetization of the reference layer 3, of the electrons forwarding from the storage layer 1 toward the reference layer 3, are returned into the storage layer 1 to supply a spin torque to the magnetization inside the storage layer 1.

The resistance value of the magnetoresistive element MTJ changes because of the magnetoresistive effect, depending on the relative directions of magnetization of the reference layer 3 and the storage layer 1. In other words, the resistance value of the magnetoresistive element MTJ becomes lower in the parallel state and higher in the antiparallel state. A value defined by $(R1-R0)/R0$ where $R0$ is the resistance value in the parallel state and $R1$ is the resistance value in the antiparallel state is called the magnetoresistive (MR) ratio.

In the present example, the magnetization of the reference layer 3 is fixed in a state of being oriented to the storage layer 1 side, but may be fixed in a state of being oriented to a side opposite to the storage layer 1. In addition, when the magnetoresistive element MTJ is disposed on the semiconductor substrate, the positional relationship in the vertical direction between the reference layer 3 and the storage layer 1 is not limited.

For example, when the reference layer 3 is disposed at an upper position than the storage layer 1, the magnetoresistive element MTJ is called a top-pin type magnetoresistive element and, when the reference layer 3 is disposed at a lower position than the storage layer 1, the magnetoresistive element MTJ is called a bottom-pin type magnetoresistive element.

Figure 13:
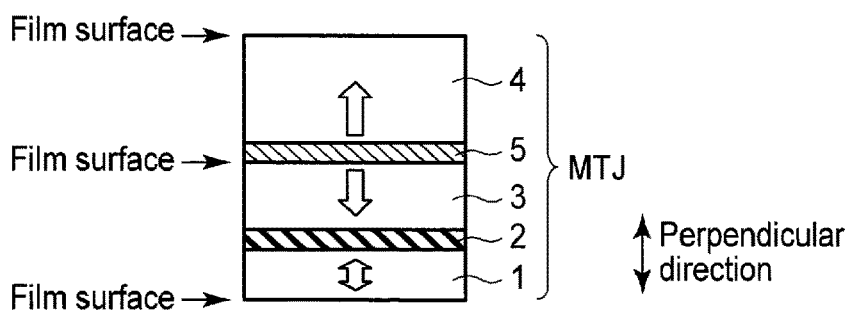

FIG. 13 shows an example of a magnetoresistive element comprising a shift canceling layer.

The magnetoresistive element MTJ has a multilayered structure in which a storage layer (ferromagnetic layer) 1 having perpendicular and variable magnetization, a tunnel barrier layer (nonmagnetic layer) 2, and a reference layer (ferromagnetic layer) 3 having perpendicular and fixed magnetization are disposed in this order in the perpendicular direction.

In addition, the magnetoresistive element MTJ comprises a shift canceling layer (ferromagnetic layer) 4 having perpendicular and fixed magnetization, on the reference layer 3 side. A nonmagnetic layer (for example, a metal layer) 5 is disposed between the reference layer 3 and the shift canceling layer 4.

In the present example, the reference layer 3 and the storage layer 1 have perpendicular magnetization. In this case, since a stray magnetic field from the reference layer 3 is oriented in the direction of magnetization (perpendicular direction) of the storage layer 1, a stray magnetic field having a large perpendicular component is applied to the storage layer 1. The stray magnetic field acts in a direction of setting the direction of magnetization of the storage layer 1 to be the same as the direction of magnetization of the reference layer 3 (parallel state).

An RH curve of the storage layer 1 is therefore shifted.

In other words, when the magnetoresistive element MTJ is changed from the antiparallel state to the parallel state, a small spin implantation current needs only to be made to flow to the magnetoresistive element MTJ and, when the magnetoresistive element MTJ is changed from the parallel state to the antiparallel state, a large spin implantation current must be made to flow to the magnetoresistive element MTJ.

In addition, the antiparallel state becomes unstable because of the stray magnetic field from the reference layer 3.

In other words, if the stray magnetic field becomes larger than the magnetic coercive force of the storage layer 1, the storage layer 1 cannot maintain the antiparallel state. In addition, even when the stray magnetic field is smaller than the magnetic coercive force of the storage layer 1, the magnetization of the storage layer 1 is often reversed from the antiparallel state to the parallel state by the stray magnetic field, in consideration of fluctuation of the magnetization caused by the thermal agitation.

The shift canceling layer 4 is disposed to solve this problem.

In the present example, the reference layer 3 and the shift canceling layer 4 are laminated on each other. In this case, the direction of magnetization of the shift canceling layer 4 is set to be opposite to the direction of magnetization of the reference layer 3. Thus, the stray magnetic field from the reference layer 3 can be canceled by a canceling magnetic field from the shift canceling layer 4, in the storage layer 1, and the shift of the RH curve of the storage layer 1 can be canceled.

CONCLUSION

According to the embodiments, lower power consumption at write can be attempted by setting the write pulse width to be variable for each memory cell.

In addition, since the time to flow the cell current at write is reduced, the write durability of the memory cell can be improved. Furthermore, since the write pulse is stopped after detecting that write to the memory cell is completed, the write error rate can be improved.

According to the nonvolatile memory of the present embodiments, noise resistance can be improved in an environment of being easily influenced by noise, such as a cache application.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile memory comprising:
   a memory cell;
   a write circuit generating a write current to change the memory cell from a first resistance value to a second resistance value;
   a first current generating circuit generating a first current based on the write current flowing through the memory cell;
   a second current generating circuit generating a second current based on the write current flowing through the memory cell;
   a hold circuit holding a first value generated based on the second current when the memory cell stores the first resistance value;
   a comparator comparing the first value with a second value generated based on a change of the first current while the memory cell changes from the first resistance value to the second resistance value; and
   a write current control circuit cutting off the write current based on a result of comparison of the comparator.

2. The memory of claim 1, wherein
   the longest period which is able to flow the write current through the memory cell is determined by a first write enable signal, the write current control circuit generates a second write enable signal shorter than the first write enable signal based on the result of comparison, and a period of flowing the write current through the memory cell is determined by the first write enable signal or the second write enable signal.

3. The memory of claim 1, wherein
   the first and second current generating circuits comprise current mirror circuits.

4. The memory of claim 1, wherein
   a value of the second current is between a value of the first current when the memory cell stores the first resistance value and a value of the first current when the memory cell stores the second resistance value.

5. The memory of claim 1, wherein
a value of the second current is smaller than a value of the first current when the memory cell stores the first resistance value, and the first resistance value is smaller than the second resistance value.

6. The memory of claim 1, wherein
a value of the second current is larger than a value of the first current when the memory cell stores the first resistance value, and the first resistance value is larger than the second resistance value.

7. The memory of claim 1, wherein
the first and second values are voltage values.

8. The memory of claim 1, wherein
the memory cell comprises a first magnetic layer having an invariable magnetization, a second magnetic layer having a variable magnetization, and a nonmagnetic layer between the first and second magnetic layers.

9. A nonvolatile memory comprising:
a memory cell;
a first circuit generating a write current flowing the memory cell;
a second circuit generating a first current smaller than the write current;
a third circuit generating a second current larger than the write current;
a fourth circuit holding a first value generated based on one of the first and second currents;
a fifth circuit comparing the first value with a second value corresponding to the write current; and
a sixth circuit cutting off the write current based on a result of comparison of the fifth circuit.

10. The memory of claim 9, wherein
the first and second circuits correspond to a first current mirror circuit, and the first and third circuits correspond to a second current mirror circuit.

11. The memory of claim 9, wherein
the first and second values are voltage values.

12. The memory of claim 9, further comprising:
a seventh circuit generating a third current corresponding to the write current, wherein the second value is generated based on the third current.

13. The memory of claim 9, further comprising:
the first value generated based on the first current is smaller than the first value generated based on the second current.

14. The memory of claim 9, wherein
the memory cell comprises a first magnetic layer having an invariable magnetization, a second magnetic layer having a variable magnetization, and a nonmagnetic layer between the first and second magnetic layers.

15. A nonvolatile memory comprising:
a memory cell;
a first FET having a gate, and generating a write current flowing the memory cell;
a second FET having a gate connected to the gate of the first FET, and generating a first current for generating a first voltage;
a third FET having a gate being selectively connectable to one of a power source terminal and the gate of the first FET, and generating a second current for generating a second voltage smaller than the first voltage;
a fourth FET having a gate being selectively connectable to one of the power source terminal and the gate of the first FET, and generating a third current for generating a third voltage larger than the first voltage;
a first circuit holding one of the second and third voltages;
a second circuit comparing the first voltage with one of the second and third voltages held in the first circuit when the first voltage changes by changing of the write current; and
a third circuit cutting off the write current based on a result of comparison of the second circuit.

16. The memory of claim 15, wherein
the first and second FETs correspond to a first current mirror circuit, the first and third FETs correspond to a second current mirror circuit, and the first and fourth FETs function as a third current mirror circuit.

17. The memory of claim 15, wherein
the second current is smaller than the write current, and the third current is larger than the write current.

18. The memory of claim 15, wherein
the third circuit cuts off the write current when the first voltage crosses over one of the second and third voltages.

19. The memory of claim 15, wherein
the gate of the third FET is connected to the gate of the first FET when the gate of the fourth FET is connected to the power source terminal.

20. The memory of claim 15, wherein
the gate of the third FET is connected to the power source terminal when the gate of the fourth FET is connected to the gate of the first FET.

* * * * *